US011963306B2

(12) United States Patent
Schmid

(10) Patent No.: US 11,963,306 B2
(45) Date of Patent: Apr. 16, 2024

(54) APPARATUS FOR MANUFACTURING PRINTED CIRCUIT BOARDS

(71) Applicant: Gebr. Schmid GmbH, Freudenstadt (DE)

(72) Inventor: Christian Schmid, Freudenstadt (DE)

(73) Assignee: Gebr. Schmid GmbH, Freudenstadt (DE)

( * ) Notice: Subject to any disclaimer, the term of this patent is extended or adjusted under 35 U.S.C. 154(b) by 0 days.

(21) Appl. No.: 16/633,840

(22) PCT Filed: Jun. 29, 2018

(86) PCT No.: PCT/EP2018/067715
§ 371 (c)(1),
(2) Date: Jan. 24, 2020

(87) PCT Pub. No.: WO2019/020318
PCT Pub. Date: Jan. 31, 2019

(65) Prior Publication Data
US 2020/0221579 A1    Jul. 9, 2020

(30) Foreign Application Priority Data
Jul. 26, 2017   (DE) ..................... 10 2017 212 887.9

(51) Int. Cl.
*H05K 3/06* (2006.01)
*H01L 21/67* (2006.01)

(52) U.S. Cl.
CPC ......... *H05K 3/068* (2013.01); *H01L 21/6708* (2013.01); *H05K 3/064* (2013.01);
(Continued)

(58) Field of Classification Search
CPC ........... H05K 3/068; H05K 2203/0165; H05K 2203/0169; H05K 2203/075;
(Continued)

(56) References Cited

U.S. PATENT DOCUMENTS

| 5,100,476 A | 3/1992 | Mase et al. |
| 5,228,949 A * | 7/1993 | Ketelhohn ............. H05K 3/068 |
| | | 216/100 |

(Continued)

FOREIGN PATENT DOCUMENTS

| CN | 1427666 A | 7/2003 |
| CN | 1717158 A | 1/2006 |

(Continued)

OTHER PUBLICATIONS

Search Report dated Jan. 24, 2022, of counterpart Taiwanese Patent Application No. 107125814, along with an English translation.

(Continued)

*Primary Examiner* — Donghai D Nguyen
(74) *Attorney, Agent, or Firm* — DLA Piper LLP (US)

(57) ABSTRACT

A method of manufacturing printed circuit boards includes some or all of: chemically or electrically applying metallic layers to a substrate; incorporating bores into the substrate; through-contacting the bores incorporated into the substrate; applying a layer from a photoresist to an electrically conducting layer in a masking step; exposing the photoresist while using an exposure mask in an exposing step; removing exposed or unexposed regions of the layer from the photoresist while in regions laying bare the electrically conducting layer in a developing step; removing the laid-bare regions of the electrically conducting layer in an etching step; cleaning the substrate in a rinsing step; and drying the substrate, wherein the substrate for carrying out the developing step and/or the etching step is set in rotation and a developer solution and/or an etching liquid is applied to the rotating substrate by at least one nozzle.

9 Claims, 4 Drawing Sheets

(52) U.S. Cl.
CPC ............... *H05K 2203/0165* (2013.01); *H05K 2203/0169* (2013.01); *H05K 2203/075* (2013.01); *H05K 2203/1509* (2013.01); *H05K 2203/1554* (2013.01); *H05K 2203/1572* (2013.01)

(58) Field of Classification Search
CPC ... H05K 2203/1509; H05K 2203/1554; H05K 2203/1572; H01L 21/6708; H01L 21/31133; H01L 21/32134; Y10T 29/49155; Y10T 29/532
USPC .................................................. 29/846, 745
See application file for complete search history.

(56) References Cited

U.S. PATENT DOCUMENTS

| | | | |
|---|---|---|---|
| 5,524,654 A | 6/1996 | Nakano | |
| 5,960,225 A * | 9/1999 | Fujimoto | G03F 7/162 396/611 |
| 6,096,233 A * | 8/2000 | Taniyama | H01L 22/26 216/92 |
| 6,491,764 B2 * | 12/2002 | Mertens | H01L 21/31133 257/E21.255 |
| 6,494,952 B1 | 12/2002 | Mann et al. | |
| 6,500,352 B1 | 12/2002 | Yoshikawa et al. | |
| 6,799,709 B2 | 10/2004 | Takaguchi et al. | |
| 7,476,290 B2 * | 1/2009 | Saito | B08B 3/02 156/345.11 |
| 8,206,548 B2 * | 6/2012 | Kajino | H01L 21/67057 216/83 |
| 8,211,242 B2 | 7/2012 | Inoue et al. | |
| 8,530,359 B2 * | 9/2013 | Mayer | H01L 21/32134 438/692 |
| 9,640,382 B2 | 5/2017 | Masuhara et al. | |
| 2001/0032657 A1 | 10/2001 | Itzkowitz | |
| 2003/0196986 A1 | 10/2003 | Tsung-Kuei et al. | |
| 2004/0000322 A1 | 1/2004 | Verhaverbeke | |
| 2004/0004724 A1 | 1/2004 | Kim et al. | |
| 2004/0031503 A1 | 2/2004 | Eitoku | |
| 2004/0087158 A1 | 5/2004 | Izumi et al. | |
| 2004/0173238 A1 | 9/2004 | Boyd et al. | |
| 2004/0226916 A1 | 11/2004 | Kobayashi et al. | |
| 2005/0205115 A1 | 9/2005 | Okuyama et al. | |
| 2007/0163715 A1 | 7/2007 | Rastegar | |
| 2007/0175863 A1 | 8/2007 | Koyata et al. | |
| 2008/0237188 A1 | 10/2008 | Kajino et al. | |
| 2009/0073394 A1 | 3/2009 | Miyagi et al. | |
| 2010/0126829 A1 | 5/2010 | Nicolet | |
| 2012/0241294 A1 | 9/2012 | Link et al. | |
| 2013/0048610 A1 | 2/2013 | Goodman et al. | |
| 2013/0219708 A1 | 8/2013 | Komatsu et al. | |
| 2014/0197129 A1 | 7/2014 | Fujii et al. | |

FOREIGN PATENT DOCUMENTS

| | | |
|---|---|---|
| CN | 101116176 A | 1/2008 |
| CN | 102441356 A | 5/2012 |
| CN | 203352955 U | 12/2013 |
| CN | 204350450 U | 5/2015 |
| CN | 103298330 B | 5/2017 |
| DE | 690 28 130 T2 | 2/1997 |
| DE | 10 2004 023 918 A1 | 12/2004 |
| DE | 10 2004 030 924 A1 | 1/2006 |
| DE | 10 2005 011 298 A1 | 9/2006 |
| DE | 10 2007 038 116 A1 | 2/2009 |
| DE | 10 2009 049 905 A1 | 4/2011 |
| JP | 64-53550 A | 3/1989 |
| JP | 5-175637 A | 7/1993 |
| JP | H06-310856 A | 11/1994 |
| JP | 8-3767 A | 1/1996 |
| JP | 8-188885 A | 7/1996 |
| JP | 9-283491 A | 10/1997 |
| JP | H09-260321 A | 10/1997 |
| JP | 10-57877 A | 3/1998 |
| JP | H11-260779 A | 9/1999 |
| JP | 2001-196349 A | 7/2001 |
| JP | 2001-7075 A | 1/2002 |
| JP | 2003-286597 A | 10/2003 |
| JP | 2005-26553 A | 1/2005 |
| JP | 2005-089819 A | 4/2005 |
| JP | 2007-326188 A | 12/2007 |
| JP | 2012-194026 A | 10/2012 |
| JP | 3186505 U | 9/2013 |
| JP | 2013-153141 A5 | 1/2016 |
| KR | 10-2004-0092015 A | 3/2004 |
| KR | 2014-0144163 A | 12/2014 |
| TW | M464973 U | 11/2013 |
| WO | 99/22877 A1 | 5/1999 |
| WO | 2009/065757 A1 | 5/2009 |
| WO | 2011/017119 A2 | 2/2011 |

OTHER PUBLICATIONS

Notice of Reason for Rejection Apr. 1, 2022, of counterpart Japanese Patent Application No. 2020-504129, along with an English translation.

Notice of Reason for Rejection dated Oct. 14, 2022, of counterpart Japanese Patent Application No. 2020-504129, along with an English translation.

Request for the Submission of an Opinion dated Feb. 13, 2023, of counterpart Korean Patent Application No. 10-2020-7005543, along with an English translation.

First Office Action dated Nov. 16, 2022, of counterpart Chinese Patent Application No. 201880062667.0, along with an English translation.

Request for the Submission of an Opinion dated Jan. 17, 2024, of counterpart Korean Patent Application No. 10-2020-7005543, along with an English translation.

* cited by examiner

APPARATUS FOR MANUFACTURING PRINTED CIRCUIT BOARDS

TECHNICAL FIELD

This disclosure relates to a method of manufacturing printed circuit boards while processing a substrate having a carrier layer from an electrically insulating material and an electrically conducting layer applied thereto.

BACKGROUND

A printed circuit board (or PCB) serves as a carrier for electronic components and guarantees the electrical contact of the latter. Almost every electronic apparatus contains one or a plurality of printed circuit boards.

Printed circuit boards comprise a flat carrier layer having a front side and a rear side, both composed of an electrically insulating material, and conductor paths, located on the carrier layer to electrically contact the electronic components. Fiber-reinforced plastics material, plastic films, or laminated paper, for example, can serve as an insulating material. The conductor paths are usually composed of a metal.

In the simplest forms, only one side of the carrier layer is provided with conductor paths. However, more than one conductor path plane is often required for more complex circuits. In such forms, both sides of a carrier layer can be provided with conductor paths. The conductor paths of the two conductor path planes in this instance are mostly electrically interconnected by way of through contacts. To this end, holes can be bored into the carrier layer and the borehole walls can be metallized, for example.

A substrate which besides the carrier layer mentioned from the electrically insulating material has an electrically conducting layer applied thereto, the conductor paths being formed from the latter, serves as the initial substrate in the manufacturing of printed circuit boards. This is performed in a multi-stage photo lithographic process while using a photoresist, the solubility thereof in a developer solution being able to be influenced by radiation, in particular by UV radiation.

In a usual procedure of forming the conductor paths, the electrically conducting layer of the initial material is masked by a layer from the photoresist. The layer from the photoresist can, for example, be laminated onto the electrically conducting layer of the initial material. The layer from the photoresist is subsequently exposed to the radiation mentioned in an exposing step, wherein part-regions of the layer by an exposure mask are protected from exposure to radiation. Depending on the photoresist and the developer solution used, either the exposed or the unexposed part-regions of the layer from the photoresist are soluble in the developer solution after the exposing step, and can be removed in a subsequent step. In the subsequent step, the developing step, part-regions of the electrically conducting layer of the initial material which in a further subsequent step, an etching step, can be removed by wet chemistry, are laid bare. The remaining deposits of the electrically conducting layer form the desired conductor path structure. The conductor path structure can optionally be laid bare and even be reinforced in a depositing step, for example, by way of the galvanic deposition of a suitable metal.

The substrate after each chemical treatment is typically treated in a rinsing step with a rinsing medium, for example, de-ionized water of high-purity. A drying step optionally follows the rinsing step before the substrate is subjected to the next processing step.

The multi-staged photo lithographic processes and in particular also the etching, rinsing, and depositing steps that adjoin the developing step can in principle be carried out either in the context of a batch method or in the context of an in-line method.

In the batch method, the substrate to be processed is treated successively in a plurality of baths that each contain different chemical treatment media. The substrate can optionally be transferred from one bath to the next bath in an automated manner, the position of the substrate during the individual treatments, however, typically not being changed. The substrate thus does not move continuously along a processing line.

In contrast, in-line methods guarantee a more rigid temporal sequence. In the in-line methods, the substrate to be processed is moved in a substantially continuous manner along a processing line. In-line methods are therefore often also referred to as continuous methods. The substrate is mostly conveyed in the manner of a conveyor belt across a roller track field, wherein the substrate in successive treatment sections of the processing line that are not rigidly delimited from one another is subjected to variable chemical and physical conditions without hereby having to leave the roller track field. An example of such a section is illustrated in FIG. 2 of DE 10 2005 011 298 A1. However, it is also possible for the substrate to be fixed in a holding installation and the holding installation to be moved along the processing line. A roller track field is thus not mandatorily required.

A holding installation suitable to this end is disclosed in DE 10 2009 049 905 A1. The holding installation comprises a rectangular frame in which the printed circuit boards can be fixed. Transport slides by which the holding installation can be transported along the processing line are disposed on two external longitudinal sides of the frame, wherein treatment sections are passed in which cleaning or etching steps, or optionally also coatings by way of the deposition of metals, are carried out. The use of such a holding installation is particularly advantageous in the manufacturing of very thin printed circuit boards.

As opposed to batch methods, in-line methods have the great advantage that a replacement of consumed treatment and rinsing media can be readily performed in a continuous manner without interrupting the method. There are, however, also disadvantages. On account of the linear method management, the substrate to be processed passes installations, for example, nozzles by way of which the substrate is sprayed with an etching liquid, exactly once along the processing line. For the desired etching result to be achieved, very many nozzles are typically installed, the nozzles being passed successively by the substrate, this potentially greatly increasing the cost of etching installations and processing lines that are equipped therewith. Throttling the speed at which the substrate passes the nozzles would be a possible alternative. However, this is not an expedient measure specifically in etching and developing steps that often represent a bottleneck in a processing line.

It could therefore be helpful to provide an improved approach to the manufacturing of printed circuit boards, which is distinguished in particular by improvements in etching and developing steps.

SUMMARY

I provide a method of manufacturing printed circuit boards while processing a substrate having a carrier layer from an electrically insulating material and an electrically conducting layer applied thereto, wherein the processing of the substrate includes some or all of: a. chemically or electrically applying metallic layers to the substrate in a metallizing step; b. incorporating bores into the substrate in a boring step; c. through-contacting the bores incorporated into the substrate in a contacting step; d. applying a layer from a photoresist to the electrically conducting layer in a masking step; e. exposing the photoresist while using an exposure mask in an exposing step; f removing exposed or unexposed regions of the layer from the photoresist while in regions laying bare the electrically conducting layer in a developing step; g. removing the laid-bare regions of the electrically conducting layer in an etching step; h. cleaning the substrate in a rinsing step; and i. drying the substrate in a drying step, wherein the substrate for carrying out the developing step and/or the etching step is set in rotation and a developer solution and/or an etching liquid is applied to the rotating substrate by at least one nozzle.

I also provide a device for manufacturing printed circuit boards while processing a substrate having a carrier layer from an electrically insulating material and an electrically conducting layer applied thereto, according to the method of manufacturing printed circuit boards while processing a substrate having a carrier layer from an electrically insulating material and an electrically conducting layer applied thereto, wherein the processing of the substrate includes some or all of: a. chemically or electrically applying metallic layers to the substrate in a metallizing step; b. incorporating bores into the substrate in a boring step; c. through-contacting the bores incorporated into the substrate in a contacting step; d. applying a layer from a photoresist to the electrically conducting layer in a masking step; e. exposing the photoresist while using an exposure mask in an exposing step; f removing exposed or unexposed regions of the layer from the photoresist while in regions laying bare the electrically conducting layer in a developing step; g. removing the laid-bare regions of the electrically conducting layer in an etching step; h. cleaning the substrate in a rinsing step; and i. drying the substrate in a drying step, wherein the substrate for carrying out the developing step and/or the etching step is set in rotation and a developer solution and/or an etching liquid is applied to the rotating substrate by at least one nozzle, the device including: a. a drive system by way of which the substrate can be set in rotation, or is coupled to such a system; and b. at least one nozzle by way of which developer solution and/or an etching liquid can be applied to the rotating substrate.

I further provide a system that manufactures printed circuit boards, including the device for manufacturing printed circuit boards while processing a substrate having a carrier layer from an electrically insulating material and an electrically conducting layer applied thereto, according to the method of manufacturing printed circuit boards while processing a substrate having a carrier layer from an electrically insulating material and an electrically conducting layer applied thereto, wherein the processing of the substrate includes some or all of: a. chemically or electrically applying metallic layers to the substrate in a metallizing step; b. incorporating bores into the substrate in a boring step; c. through-contacting the bores incorporated into the substrate in a contacting step; d. applying a layer from a photoresist to the electrically conducting layer in a masking step; e. exposing the photoresist while using an exposure mask in an exposing step; f removing exposed or unexposed regions of the layer from the photoresist while in regions laying bare the electrically conducting layer in a developing step; g. removing the laid-bare regions of the electrically conducting layer in an etching step; h. cleaning the substrate in a rinsing step; and i. drying the substrate in a drying step, wherein the substrate for carrying out the developing step and/or the etching step is set in rotation and a developer solution and/or an etching liquid is applied to the rotating substrate by at least one nozzle, the device including: a. a drive system by way of which the substrate can be set in rotation, or is coupled to such a system; and b. at least one nozzle by way of which developer solution and/or an etching liquid can be applied to the rotating substrate.

BRIEF DESCRIPTION OF THE DRAWINGS

FIG. 3b shows a plan view of the forward-pointing side of the device illustrated in FIG. 3a.

FIG. 3c shows a plan view of the rearward-pointing side of the device illustrated in FIG. 3a.

DETAILED DESCRIPTION

Figure 1:
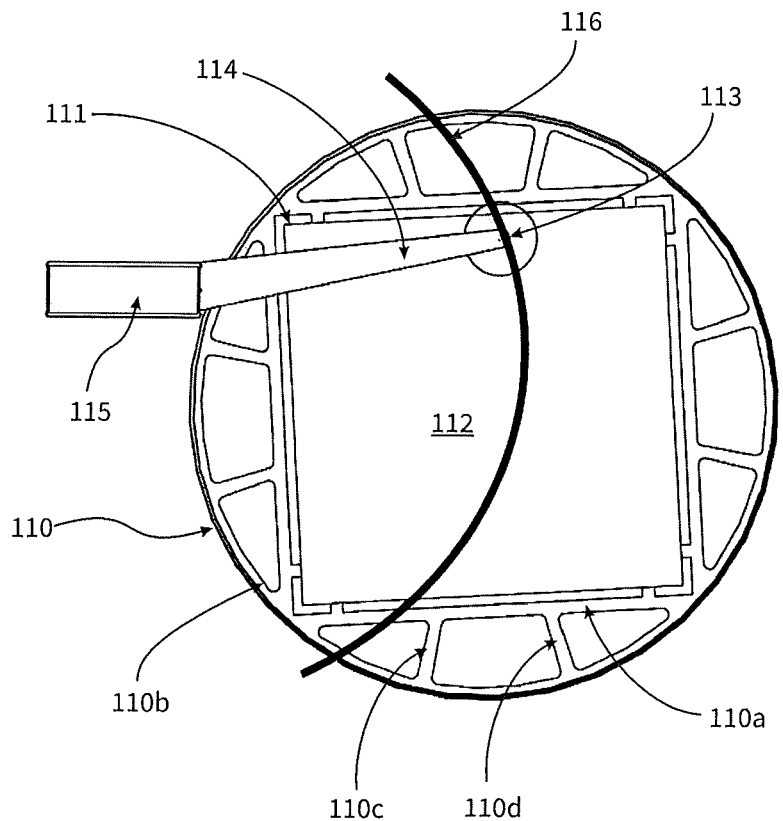
FIG. 1 schematically shows an annular support frame that is capable of being used in the method, conjointly with a square printed circuit board substrate fixed therein, and a movable nozzle to apply etching liquid and/or developer solution to the substrate, the nozzle being fastened to a pivotable arm (plan view from above).

My method serves for the manufacturing of printed circuit boards. The processing of a substrate having a carrier layer from an electrically insulating material and an electrically conducting layer (also referred to as the printed circuit board substrate) applied thereto is performed herein. The processing of the substrate herein comprises some or all of the following processing steps:

chemically or electrically applying metallic layers to the substrate in a metallizing step;
incorporating bores into the substrate in a boring step;
through-contacting the bores incorporated into the substrate in a contacting step;
applying a layer from a photoresist to the electrically conducting layer in a masking step;
exposing the photoresist while using an exposure mask in an exposing step;
removing exposed or unexposed regions of the layer from the photoresist while in regions laying bare the electrically conducting layer in a developing step;
removing the laid-bare regions of the electrically conducting layer in an etching step;
cleaning the substrate in a rinsing step;
drying the substrate in a drying step.

The method can optionally comprise even further processing steps not listed here. Many of the steps mentioned, for example, the rinsing step and the drying step can also be performed repeatedly, the rinsing step and drying step potentially being connected to both the developing step as well as the etching step.

In terms of the scope of the first-mentioned steps, in particular of the boring step, of the contacting step, of the masking step, and of the exposing step, my method does not differ from known methods. However, points of differentiation arise in view of the developing step, the etching step, or even both steps. Furthermore, points of differentiation also arise in terms of the rinsing step and/or the drying step.

My method is in particular distinguished in that the substrate for carrying out the developing step and/or the etching step is set in rotation and a developer solution and/or an etching liquid is applied to the rotating substrate by at least one nozzle. In short, both the developing step as well as the etching step and both steps can be carried out by way of a rotating substrate.

This approach is associated with a whole host of advantages. On account of the rotation, individual regions of the substrate pass the effective range of the nozzle not once but multiple times. The nozzle used can thus be employed more efficiently than the nozzles in the linear method management discussed above. For the same method result to be achieved, consequently far fewer nozzles are required which in turn allows the use of very high-end expensive nozzles to be seen as economical. A modification of the etching liquids and developer solutions used is not required. The same chemicals also used in classic etching and developing steps can be used. Irrespective thereof, a surprisingly significant reduction in the recirculation of chemicals has been observed in comparative experiments. And since the application of developer solution and/or etching liquid to the rotating substrate can be carried out in a comparatively space-saving manner, significantly less exhaust air also arises.

The method can be carried out in a particularly advantageous manner when the substrate is disposed in an annular support frame that conjointly with the substrate is set in rotation. It is possible herein for the substrate to be fixed directly in the support frame. However, the substrate can also first be fixed in a rectangular frame of a holding installation, the latter conjointly with the substrate then being disposed in the annular support frame. This can then be particularly expedient when the substrate for upstream processing steps has to be fixed anyway in the holding installation, for example, for treatment steps performed in a processing line operated according to the continuous method.

It is particularly preferable for rectangular printed circuit boards, in particular having the following dimensions, to be processed in the context of the method:
thickness: 1 µm to 10 mm
length: up to 700 mm
width: up to 700 mm.

The substrate for carrying out the developing step and/or the etching step is particularly preferably transferred to a treatment chamber. One of the steps, or both steps successively, can be carried out in the treatment chamber.

The substrate in the treatment chamber is preferably set in rotation by a drive system that can exert a tangential force on the annular support frame.

In principle, the developing step and/or the etching step can be completed both on a horizontally aligned substrate as well as on a vertically aligned substrate. However, particularly preferably, the substrate in the treatment chamber is vertically aligned, in particular conjointly with the annular support frame. The developing step and/or the etching step are then completed on the vertically aligned, rotating substrate.

It is known that printed circuit boards having more than one conductor path plane are required for more complex circuits. My method is also suitable for manufacturing such printed circuit boards. To this end, a substrate in which the carrier layer has a front side and a rear side to which each one electrically conducting layer is applied is processed. Such a substrate hereunder is also referred to as a substrate coated on both sides.

It is preferable in these instances for the front side and the rear side of the substrate to be simultaneously subjected to the developing step and/or to the etching step, in particular in the treatment chamber. The front side is particularly preferably sprayed with the developer solution and/or the etching liquid by a first nozzle, while the rear side is simultaneously sprayed with the developer solution and/or the etching liquid by a second nozzle.

The simultaneous processing of the front side and rear side is particularly advantageous in the vertical alignment of the substrate mentioned. In a horizontal process puddles can form on the upper side of a flat substrate. Dissimilar processing results can result therefrom. By contrast, in vertical processing, developer solution or etching fluid that has been sprayed on can run off in a uniform manner. The treatment intensity can be maintained to be the same on the front side and on the rear side.

Particularly preferably:
in addition to the etching step also a directly preceding and/or a directly succeeding rinsing step
and/or
in addition to the developing step also a directly preceding and/or a directly succeeding rinsing step
can be carried out in the treatment chamber. De-ionized water is preferably used herein as the rinsing medium.

In addition to one of the rinsing steps, a directly succeeding drying step can also be particularly advantageously carried out in the treatment chamber.

The additional rinsing steps as well as the additional drying steps in the processing of a substrate coated on both sides can be carried out, like the developing and/or the etching step, simultaneously on the front side and the rear side of the substrate. To this end, a plurality of nozzles by way of which the front side and the rear side can simultaneously be impinged with a rinsing medium and/or compressed air can be provided.

It becomes evident by the explanations above that quite a number of processing steps which in the in-line methods along a processing line are carried out in successive treatment sections can be performed according to my method in one and the same treatment chamber. For example, the following can be performed successively:
the substrate can be transferred into the treatment chamber and set in rotation;
the developer solution can be applied to the rotating substrate;
the rotating substrate can be cleaned with a rinsing medium;
the cleaned rotating substrate can be treated with an etching liquid; and
the rotating substrate after treatment with the etching liquid can be cleaned once more with the rinsing medium.

Particularly preferably, the method is distinguished by one or both of the following steps:
the substrate, for the developing step and/or the etching step to be carried out, is diverted from a processing line that is operated by the continuous method or by the batch method,
the substrate, after carrying out the developing step and/or the etching step, is returned to a processing line operated by the continuous method or the batch method.

It can thus be preferable, for example, for the masking step and exposing step to be carried out in different treatment sections of an in-line method and for the substrate, for the developing step and the etching step as well as an interposed rinsing step that follows the etching step to be diverted from the processing line. Optional subsequent steps, for example, a final drying step, can be carried out again as an in-line method.

In principle, however, it is also possible, optionally even preferable, for the drying step to also be carried out in the treatment chamber on the rotating substrate.

It is particularly advantageous for the developer solution and/or the etching liquid to be applied to the rotating substrate by the movable nozzle. The nozzle for this purpose is preferably fastened to an arm.

Preferably, the position of the nozzle relative to the rotation axis of the rotating substrate is varied when carrying out the developing step and/or the etching step. To this end, the nozzle can be fastened, for example, to a pivotable and/or a displaceable arm, as will yet be explained below, such that the variation of the position of the nozzle can be caused by a pivoting movement and/or a displacement of the arm. This has the advantage that each point on the substrate can be sprayed perpendicularly from above, this guaranteeing an optimal and uniform spray effect.

Alternatively, it is also possible for the developer solution and/or the etching liquid to be applied to the rotating substrate by a plurality of immovable nozzles, the position of the latter relative to the rotation axis of the rotating substrate being different in each instance. However, this variant of the method is less preferable.

The rinsing medium can in principle be applied to the substrate like the developer solution and the etching liquid by way of the movable nozzle. However, after completion of the developing step and/or of the etching step, the rinsing medium in preferred configurations is applied to the rotating substrate by the plurality of immovable nozzles, the position of the latter relative to the rotation axis of the rotating substrate being different in each instance. The nozzles for this purpose are preferably fastened in a row on a support arm.

The plurality of immovable nozzles can also serve for blowdrying the substrate after completion of the rinsing step. To this end, the nozzles can be coupled to a compressed-air source, for example.

My device is particularly suitable for carrying out the method and is distinguished by the following features:
- the device possesses a drive system by way of which the substrate can be set in rotation, or is coupled to such a system; and
- the device possesses the at least one nozzle by way of which the developer solution and/or the etching liquid can be applied to the rotating substrate.

An ultrasonic nozzle which, besides an outlet for the liquid to be applied, comprises an ultrasonic generator that can preferably be used as a nozzle. The ultrasonic sound generated is transferred to the substrate by way of the liquid exiting the nozzle and can significantly accelerate etching and developing procedures.

The device particularly preferably comprises a housing that encloses an interior space in which a receptacle for the substrate to be treated is located. The interior space of the housing having the receptacle can serve as the treatment chamber mentioned above.

As mentioned above, it can be advantageous for the substrate to be fixed in a holding installation during the method. It can furthermore be advantageous for the substrate, or the holding installation conjointly with the substrate fixed therein, to be positioned in an annular support frame before the substrate, for the developing step and/or the etching step to be carried out, is set in rotation. The annular support frame herein can be a component part of the device, or as a replaceable frame, in each instance conjointly with a substrate to be treated, can be introduced into the device.

When the annular support frame is a component part of the device, the annular support frame per se thus can have the receptacle for the substrate to be treated. A substrate to be treated can first be fixed in the holding installation, the latter then being positioned in the receptacle in the annular support frame. Alternatively, the substrate to be treated can be fixed directly in the receptacle in the annular support frame.

When each annular support frame as a replaceable frame, conjointly with a substrate to be treated, is introduced into the device, the receptacle is thus preferably configured to rotatably mount the annular support frame in the device.

When the annular support frame is used, the device preferably, independently of whether or not the annular support frame is a component part of the device, has a plurality of rollers and/or shafts on which the periphery of the annular support frame set in rotation can roll.

In the use of the annular support frame, it is furthermore preferable for the device to comprise at least one drive shaft that can exert a tangential force on the periphery of the annual support frame for the support frame to be set in rotation.

Preferably, the device comprises the at least one drive shaft mentioned, and moreover two or three guide rollers for the annular support frame to be held in the plane of rotation. The guide rollers and also the at least one drive shaft herein can be mounted in a sprung manner.

Both the at least one drive shaft as well as the guide rollers can have encircling depressions, in particular encircling groove-type depressions, in which the periphery of the annular support frame set in rotation can roll.

The drive shaft and the guide rollers are particularly preferably positioned in the interior space such that the periphery of an annular support frame, which is positioned vertically in the interior space, can roll on the shaft and the guide rollers as the frame rotates.

The drive system of the device preferably comprises the drive shaft mentioned. The drive system can furthermore comprise a motor and optionally a drive unit to couple the motor to the drive shaft.

The at least one nozzle by way of which the developer solution and/or the etching liquid can be applied to the rotating substrate is preferably movably mounted, in particular pivotably or displaceably mounted. To this end, the nozzle can in particular be fastened to a pivotable or displaceable arm. However, it is also possible for the at least one nozzle to be mounted to be displaceable in a rail, for example.

Preferably, the device comprises a further drive system configured to pivot or displace the pivotable or displaceable arm, or to displace the nozzle mounted to be displaceable in the rail, or is coupled to such a drive system.

Particularly preferably, the device comprises an electronic control unit coupled to both drive systems and can mutually tune the mechanical actions of the drive systems, for example, can adapt the speed at which the substrate rotates to the speed at which the nozzle is pivoted.

Particularly preferably, the device comprises at least two nozzles by way of which developer solution and/or etching liquid can be applied to the rotating substrate, wherein the nozzles within the device are disposed such that in a substrate coated on both sides, the front side thereof and the rear side thereof can be simultaneously sprayed by the nozzles. For example, a first one of the nozzles can be disposed such that the nozzle can spray the front side of the substrate, while a second one of the nozzles sprays the rear side of the substrate. It is preferable herein for each of the nozzles to be fastened to a pivotable or displaceable arm.

The device for this purpose particularly preferably has a double arm each having two pivotable or displaceable arms, at least one of the nozzles being fastened to each of the arms. In principle, the two arms can be pivotable or displaceable in a mutually independent manner. However, the two arms are preferably fixed to a common pivot axle and are aligned to be mutually parallel such that the arms and the nozzles fastened thereto conjointly perform each pivoting movement.

The arms of the double arm herein are preferably mutually spaced apart such that the annular support frame conjointly with the substrate can rotate therebetween. The nozzles fastened to the arms herein are preferably aligned such that the spraying direction of the nozzles is directed perpendicularly to the rotating substrate.

The device is most typically coupled to an etching liquid reservoir and/or to a developer solution reservoir from which the etching liquid and/or the developer solution can be transported to the at least one nozzle. The device can furthermore optionally also be coupled to a rinsing medium conveying means from which rinsing medium can be transported into the device, optionally also to the nozzle.

Preferably, the device possesses dedicated etching liquid conveying means and/or developer solution conveying means by which developer solution and/or an etching liquid can be transported from an etching liquid reservoir and/or developer solution reservoir to the nozzle. The device optionally furthermore also possesses rinsing medium conveying means by way of which rinsing means can be transported to the nozzle.

It is already implicitly derived from the above explanations that the nozzle preferably is coupled to the etching liquid reservoir and/or to the developer solution reservoir and optionally to the rinsing medium reservoir.

Particularly preferably, the nozzle and the etching liquid reservoir and the developer solution reservoir are coupled to one another by at least one valve, in particular a multiway valve. The multiway valve in a first switching position blocks the transportation path for etching liquid to the nozzle and opens the transportation path for developer solution to the nozzle. The multiway valve in a second switching position opens the transportation path for etching liquid to the nozzle and blocks the transportation path for developer solution to the nozzle. When the rinsing medium reservoir is additionally coupled to the nozzle, in particular by way of the multiway valve in a third switching position in which only the transportation path for rinsing medium to the nozzle is opened, the nozzle and of course also the substrate can thus be cleaned with rinsing medium between developing and etching procedures.

However, the movable nozzle is not mandatorily required to clean the substrate. Rather, it is preferable for the device, besides the movable nozzle, to also possess a plurality of immovable nozzles, the position of the latter relative to the rotation axis of the rotating substrate being different in each instance, and the immovable nozzles being coupled to the rinsing medium reservoir. The cleaning of the substrate can thus also be performed by these immovable nozzles.

It can be furthermore preferable for the device to possess a plurality of immovable nozzles, the position of the latter relative to the rotation axis of the rotating substrate each being different, and the immovable nozzles being coupled to a compressed-air source. The substrate can be subjected to a drying step by way of the nozzles.

Preferably, the device has a plurality of immovable nozzles, the position of the latter relative to the rotation axis of the rotating substrate each being different, and the immovable nozzles being coupled to the rinsing medium reservoir as well as to the compressed-air source, here preferably also by way of a multiway valve that can selectively block access to the rinsing medium reservoir and to the compressed-air source.

The immovable nozzles can, for example, be fastened in a row to an immovable, rigidly fixed arm which is aligned to be parallel with a surface to be treated of the rotating substrate, such that all nozzles have the same spacing from the surface.

The device particularly preferably has an outlet for consumed etching fluid and/or consumed developer solution and/or consumed rinsing medium. This outlet is typically disposed at the lowest point of the housing. The outlet can be coupled to a multiway valve for the liquids to be discharged to be fed to their respective intended destination. The interior space of the housing by way of the multiway valve in a first switching position can thus be connected to a container for consumed developer solution, and in a second switching position can be connected to a container for consumed etching liquid. It is also possible for the developer solution in a recirculating method to be fed once more to the developer solution reservoir and/or for the etching liquid in a recirculating method to be fed once more to the etching liquid reservoir.

It is furthermore preferable for the treatment chamber to be coupled to an exhaust air system.

Preferably, the device can have temperature control means for the etching solution and/or and the developer solution, prior to the application thereof, to be heated or cooled to a desired application temperature.

Each system for manufacturing printed circuit boards, which comprises the device described, is likewise the subject matter of this disclosure.

As is already implicitly derived from the explanations above, such a system, besides the device, can in particular also comprise modules in which treatment steps are carried out in the continuous method or in the batch method, thus, for example, modules in which the masking step and the exposing step are carried out in the continuous method.

Further features, details, and advantages are derived from the appended claims and abstract, the wording of both being incorporated in the content of the description by reference, from the following description of preferred example, and by the drawings.

The annular support frame 110 illustrated in FIG. 1 has a central receptacle 111 defined by a square frame 110a and in which a square printed circuit board substrate 112 is fixed. The square frame 110a in turn is framed by an external ring 110b and fixedly connected to the latter by way of a plurality of stays, inter alia the stays 110c and 110d. A movable nozzle 113 is located on the lower side of the tip of the pivotable arm 114 fastened to a pivot axle (not visible here) which is coupled to the drive unit 115.

The movable nozzle 113, on account of the pivoting of the arm 114, is enabled to act on the printed circuit board substrate 112 along the circular line 116. In a simultaneous rotation of the annular support frame 110 and of the printed circuit board substrate 112 fixed therein, depending on the pivoting position, each point on the printed circuit board substrate 112 can be reached and sprayed perpendicularly to the plane of the printed circuit board substrate 112 by way of the movable nozzle 113.

Figure 2:
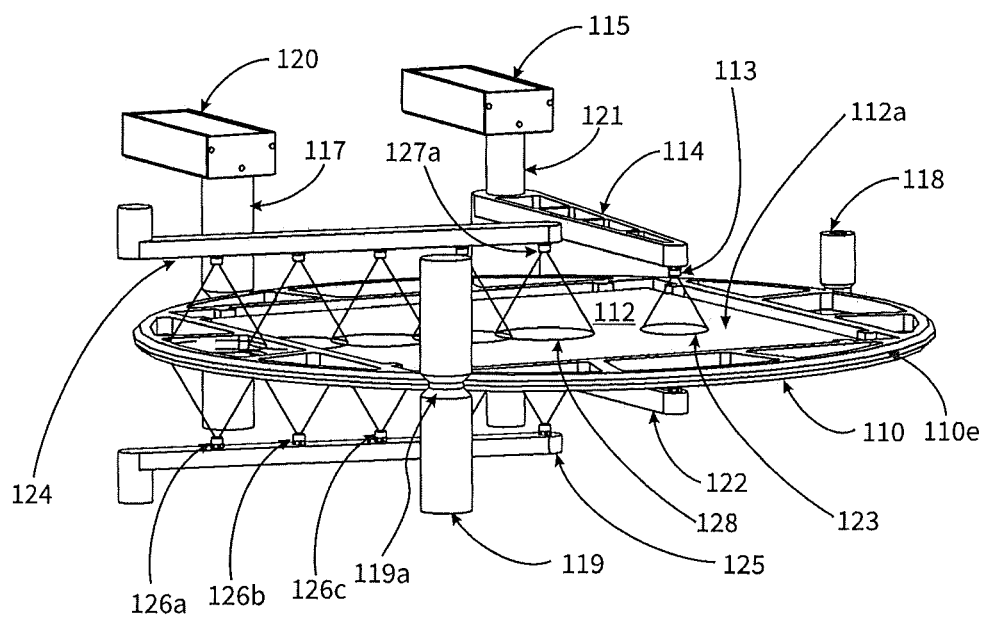
FIG. 2 schematically shows an arrangement comprising a drive shaft and a plurality of rollers and nozzles which, for the purpose of carrying out a developing step and/or etching step, are grouped around a printed circuit board substrate that is fixed in an annular support frame according to FIG. 1 (perspective illustration obliquely from the front).

The arrangement illustrated in FIG. 2 comprises the drive shaft 117 and the guide rollers 118 and 119 which form a receptacle for the annular support frame 110 illustrated in FIG. 1, conjointly with the printed circuit board substrate 112 fixed therein. The drive shaft 117 by way of the drive unit 120 is coupled to a motor (not illustrated) which drives the drive shaft 117. Both the drive shaft 117 as well as the guide rollers 118 and 119 have encircling groove-type depressions in which the periphery 110*e* of the annular support frame 110 set in rotation can roll. The encircling groove 119*e* in the guide roller 119 is readily visible, for instance. The guide roller 118, for example, by a pivot arm or a spring (not illustrated here), can be pressed against the periphery 110*e*. When the drive shaft 117 rotates, the drive shaft 117 thus exerts a tangential force on the periphery 110*e*, bearing on the former, of the annular support frame 110 and sets the support frame 110 conjointly with the substrate 112 located therein in rotation.

The pivotable arms 114 and 122 are fastened to the pivot axle 121. Each nozzle by way of which the printed circuit board substrate 112 can be sprayed with etching liquid or with a developer solution being fastened to the arms 114 and 122. The pivotable arms 114 and 122, conjointly with the pivot axle, form a double arm. The arms 114 and 122 herein are aligned to be mutually parallel and move in a mutually synchronous manner. The surfaces of the printed circuit board substrate 112 can each be sprayed perpendicularly from above by way of the nozzles fastened to the arms 114 and 122, for instance the surface 112*a* of the printed circuit board substrate by the movable nozzle 113 which is fixed to arm 114. When the nozzle 113 and the printed circuit board substrate 112 are each rigid and immovable, the effective range of the nozzle 113 is be limited to the spray cone 123. However, since the printed circuit board substrate 112 rotates when being treated and the nozzle 113 is pivotable, each point on the surface 112*a* can be sprayed by the nozzle 113. The same applies in analogous manner for the lower side (not illustrated) of the printed circuit board substrate 112. The lower side can be reached at each point by the nozzle fastened to the arm 122.

Five nozzles are each fastened in a row to two immovable arms 124 and 125 that are aligned to be mutually parallel, the arms 124 and 125 potentially being fixed, for example, to the housing of a device. The printed circuit board substrate 112 can be sprayed with a rinsing medium by the nozzles. The surface 112*a* can thus be reached by the nozzle 127*a*, for example, the effective range of the latter being limited to the spray cone 128. The lower side (not illustrated here) of the printed circuit board substrate 112 can be reached, for example, by the nozzles 126*a*, 126*b*, and 126*c*. These spacings of the nozzles fastened to the arms are dimensioned such that the effective ranges of neighbouring nozzles, for instance of the nozzles 126*b* and 126*c*, overlap one another. Despite the arms 124 and 125 being configured not to be pivotable, each point of the surfaces of the rotating printed circuit board substrate 112 can thus be reached by the nozzles.

Preferably, the arrangement has a plurality of immovable nozzles 126*a*, 126*b* and 126*c*, the position of the latter relative to the rotation axis of the rotating substrate 112 each being different, and which are coupled to the rinsing medium reservoir as well as to the compressed-air source, here preferably also by way of a multiway valve which can selectively block access to the rinsing medium reservoir and to the compressed-air source.

The immovable nozzles can, for example, be fastened in a row to an immovable, rigidly fixed arm which is aligned to be parallel with a surface to be treated of the rotating substrate 112 such that all nozzles have the same spacing from the surface.

Figure 3A:
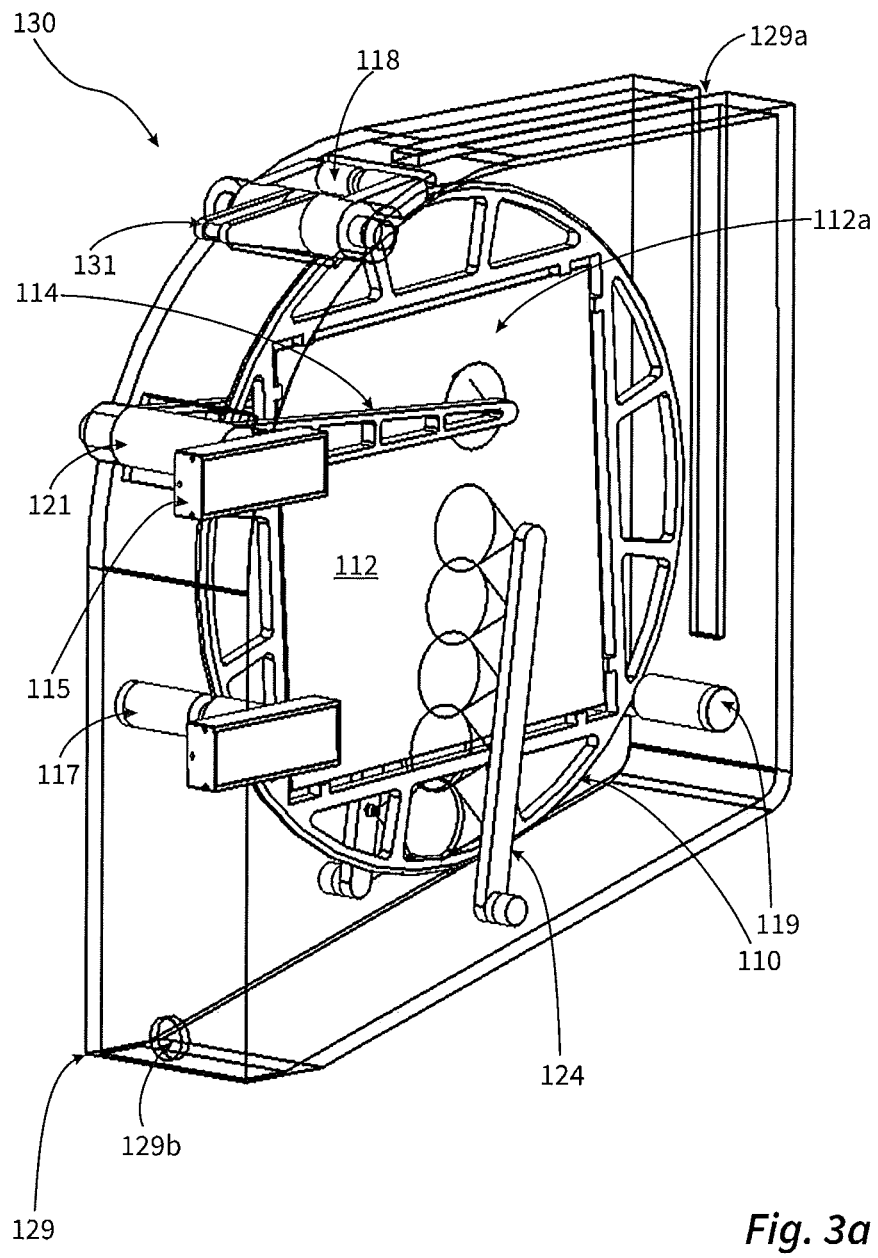
FIG. 3a schematically shows a device comprising the arrangement illustrated in FIG. 2, in a vertical alignment in a housing.

The device 130 illustrated in FIG. 3*a* comprises the transparent housing 129 and the arrangement illustrated in FIG. 2 in a vertical alignment, the arrangement being disposed in the interior space defined by the housing 129. The printed circuit board substrate 112 here can be vertically rotated and be sprayed with etching liquid or developer solution.

The housing 129 has the slot-shaped inlet 129*a* through which the annular support frame 110, disposed within the housing 129, conjointly with the printed circuit board substrate 112 fixed therein, can be removed after the completed treatment. The inlet 129*a* can be closed for the housing to be sealed.

The outlet 129*b* is located at the lowest point of the housing 129. This outlet is coupled to a multiway valve (not illustrated) for the liquids to be discharged to be fed to their respective intended destination. The valve in a first switching position connects the interior space of the housing 129 to a container for consumed developer solution, and in a second switching position to a container for consumed etching liquid.

The device illustrated for reasons of clarity is not shown with all functional parts thereof. For example, supply lines for etching liquid and developer solutions, fastening means, and electrical components for the drive of the drive shaft 117 and the drive unit 115 are absent.

In contrast, the pivot arm 131 by way of which the guide roller 118 can be pressed against the periphery of the annular support frame 110 is illustrated.

Figure 3B:
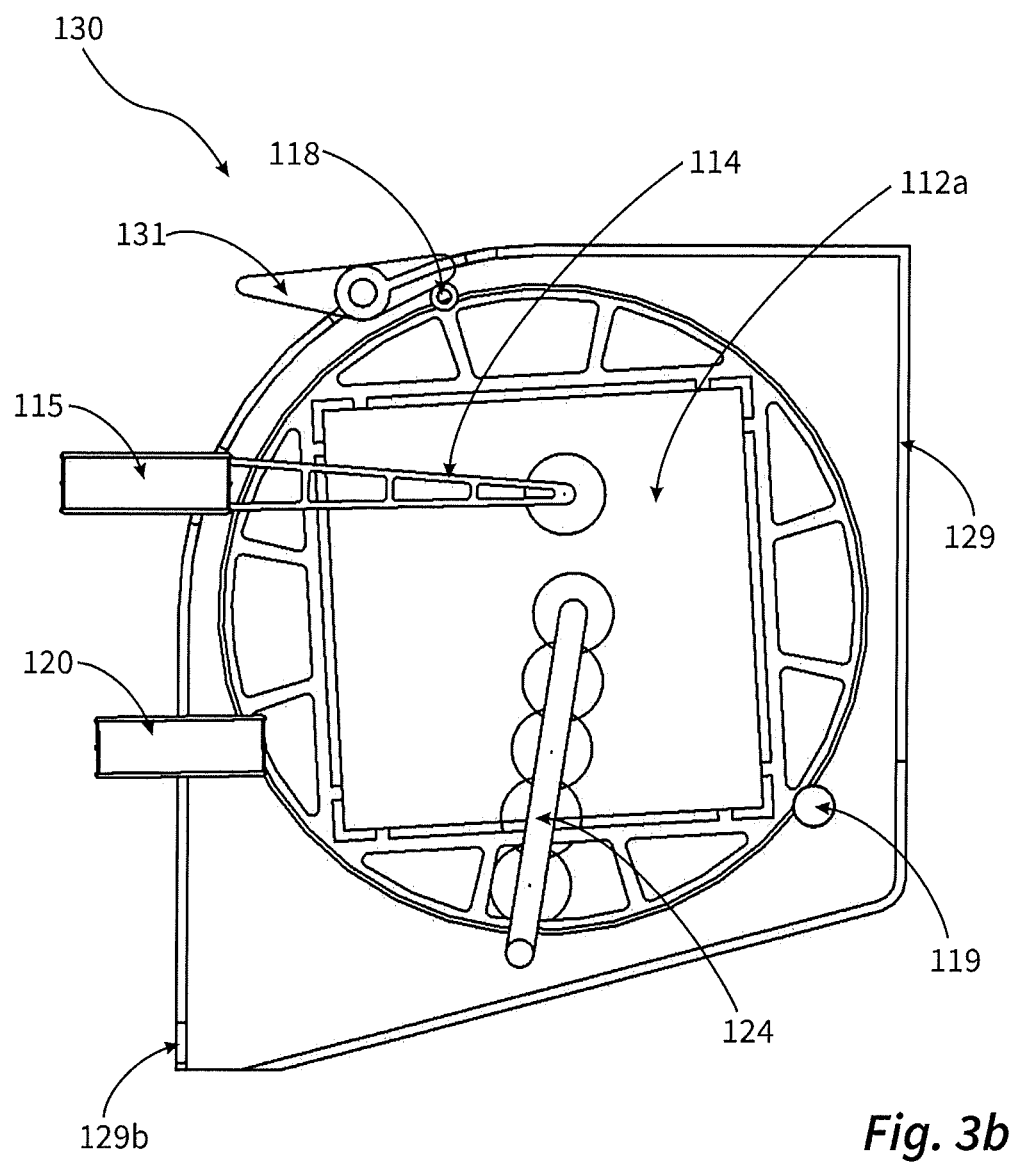
Figure 3C:
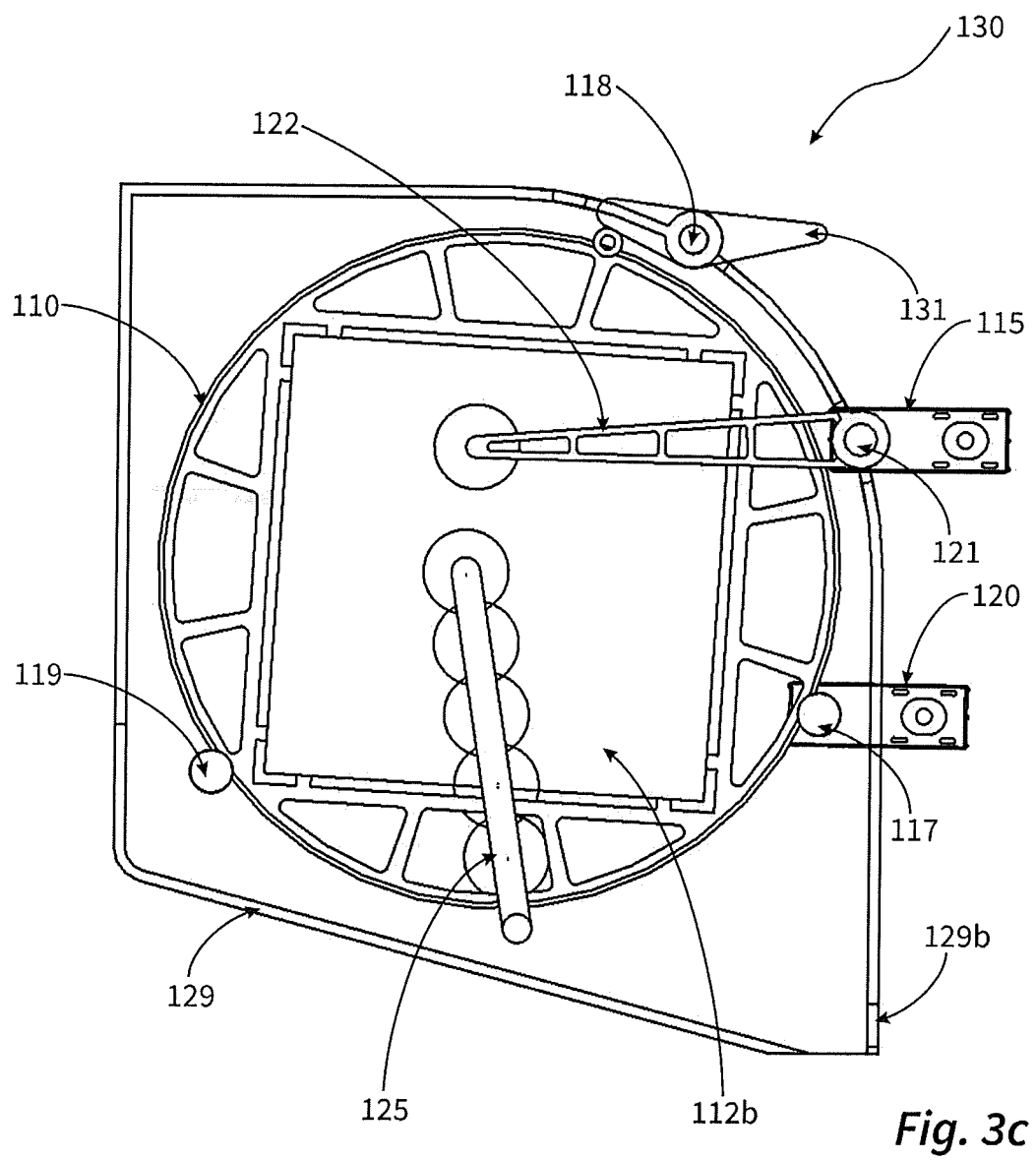

A plan view of the forward-pointing side of the device illustrated in FIG. 3*a* is illustrated in FIG. 3*b*; a plan view of the rearward-pointing side of the device illustrated in FIG. 3*a* is illustrated in FIG. 3*c*.

The invention claimed is:

1. A device for manufacturing printed circuit boards, the circuit boards each comprising:
    1) a substrate having opposite-facing front side and rear side surfaces and having a carrier layer from an electrically insulating material, and
    2) an electrically conducting layer applied to the substrate, said device comprising:
  a. a drive system by way of which the substrate can be set in rotation;
  b. at least two nozzles configured such that developer solution and/or an etching liquid can be applied simultaneously to both of the front side and rear side surfaces of the rotating substrate, and
  c. a housing that encloses an interior space,
  wherein:
    at least a first nozzle of the at least two nozzles is attached to a pivotable or displaceable arm,
    the arm is pivotable or displaceable relative to a rotation axis of the rotating substrate,
    a pivoting movement and/or a displacement of the arm varies a position of the first nozzle relative to the rotation axis of the rotating substrate such that each point on the front side or rear side surfaces of the rotating substrate can be sprayed perpendicularly with the developer solution and/or etching liquid by the first nozzle, and the drive system is configured to set an annular support frame, which is positioned vertically in the interior space, into rotation.

2. The device according to claim 1, wherein the housing serves as a treatment chamber and encloses the interior space in which a receptacle for the substrate to treated is located.

3. The device according to claim 2, having at least one of:

a. the receptacle is configured to rotatably mount the annular support frame in which the substrate is disposed;

b. the annular support frame comprises a receptacle for the substrate;

c. the device comprises a plurality of rollers and/or shafts on which the periphery of the annular support frame that has been set in rotation can roll;

d. the device comprises at least one drive shaft that can exert a tangential force on the periphery of the annular support frame for the support frame to be set in rotation; and e. the device comprises two or three guide rollers for the annular support frame to be held in the plane of rotation.

4. The device according to claim 1, having at least one of:

a. the nozzles by way of which the developer solution and/or the etching liquid can be applied to the rotating substrate are movably mounted;

b. the at least two nozzles are pivotably or displaceably mounted;

c. the at least two nozzles are fastened to a pivotable or displaceable arm;

d. the at least two nozzles are mounted to be displaceable in a rail;

e. the nozzles are fastened to a pivotable or displaceable arm; and f. a first one of the at least two nozzles is disposed such that the nozzle can spray a front side of the substrate, while a second one of the at least two nozzles is disposed such that the nozzle can spray a rear side of the substrate.

5. The device according to claim 1, having at least one of:

a. the at least two nozzles are coupled to an etching liquid reservoir and to a developer solution reservoir; and b. the nozzles and the etching liquid reservoir and the developer solution reservoir are coupled to one another by way of a multiway valve which in a first switching position blocks a transportation path for etching liquid to the nozzle and opens a transportation path for developer solution to the nozzle, and in a second switching position opens the transportation path for etching liquid to the nozzle and blocks the transportation path for developer solution to the nozzle.

6. The device according to claim 5, wherein the at least two nozzles are coupled to a rinsing medium reservoir.

7. The device according to claim 1, having at least one of:

a. the device possesses a plurality of immovable nozzles, a position of which relative to the rotation axis of the rotating substrate being different, and said immovable nozzles being coupled to a rinsing medium reservoir; and b. the device possesses a plurality of immovable nozzles, the position of the latter relative to the rotation axis of the rotating substrate each being different, and said immovable nozzles being coupled to a compressed-air source.

8. The device according to claim 1, further comprising:

an outlet for consumed etching fluid and/or consumed developer solution and/or consumed rinsing medium.

9. A system that manufactures printed circuit boards, comprising the circuit device to claim 1, such that the system further comprises at least one module in which a layer from a photoresist is applied to the electrically conducting layer of the substrate in a masking step and the photoresist is exposed while using an exposure mask in an exposing step.

\* \* \* \* \*